United States Patent
Savatski et al.

(10) Patent No.: US 8,947,899 B2
(45) Date of Patent: Feb. 3, 2015

(54) SPLIT LAMINATED DC BUS STRUCTURE

(75) Inventors: Robert Allen Savatski, Port Washington, WI (US); Michael Loth, Germantown, WI (US); Lee Gettelfinger, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 17 days.

(21) Appl. No.: 13/415,893

(22) Filed: Mar. 9, 2012

(65) Prior Publication Data

US 2013/0234636 A1 Sep. 12, 2013

(51) Int. Cl.
*H04M 1/00* (2006.01)

(52) U.S. Cl.
USPC .......................................... 363/144; 174/68.2

(58) Field of Classification Search
USPC ............ 174/68.2; 361/715; 363/144, 132, 56, 363/137, 141
See application file for complete search history.

(56) References Cited

U.S. PATENT DOCUMENTS

| | | | | |
|---|---|---|---|---|
| 5,132,896 A | * | 7/1992 | Nishizawa et al. | 363/144 |
| 5,365,424 A | * | 11/1994 | Deam et al. | 363/144 |
| 6,956,742 B2 | * | 10/2005 | Pfeifer et al. | 361/709 |
| 7,692,525 B1 | * | 4/2010 | Halpin et al. | 336/96 |
| 2006/0092611 A1 | * | 5/2006 | Beihoff et al. | 361/698 |
| 2008/0202899 A1 | * | 8/2008 | Radosevich et al. | 200/50.2 |
| 2009/0015992 A1 | * | 1/2009 | Nohara et al. | 361/624 |
| 2013/0322141 A1 | * | 12/2013 | Kobayashi et al. | 363/123 |

* cited by examiner

*Primary Examiner* — Eduardo Colon Santana
*Assistant Examiner* — Bickey Dhakal
(74) *Attorney, Agent, or Firm* — Fay Sharpe LLP

(57) ABSTRACT

An apparatus and method for mounting additional components, such as capacitors, to a DC bus of a motor drive. In one aspect, a motor drive includes an enclosure defining an interior, an input for receiving input electrical power from a power source, an output for providing output electrical power to a load, an intermediate DC circuit including a DC bus located in the interior of the enclosure, and a modular capacitor bus electrically coupled with the intermediate DC circuit, the modular capacitor bus including at least one capacitor mounted thereto. The modular capacitor bus is mountable as a unit to the DC bus.

17 Claims, 6 Drawing Sheets

US 8,947,899 B2

SPLIT LAMINATED DC BUS STRUCTURE

BACKGROUND

The present exemplary embodiment relates generally to electrical power conversion. It finds particular application in conjunction with motor drives, and will be described with particular reference thereto. However, it is to be appreciated that the present exemplary embodiment is also amenable to other like applications.

Power conversion systems convert electrical power from one form to another and may be employed in a variety of applications such as motor drives for powering an electric motor using power from an input source. Typically, the power converter is constructed using electrical switches actuated in a controlled fashion to selectively convert input power to output power of a desired form such as single or multi-phase AC of a controlled amplitude, frequency and phase to drive an AC motor according to a desired speed and/or torque profile, often in the presence of varying load conditions. In a typical situation, one or more AC motor drives are connected to an AC power bus or point of common coupling along with other loads where a common AC power source provides current to all these loads via the common bus. The AC drives may be equipped with power factor correction (PFC) apparatus to operate the drive at or near unity power factor. Such apparatus' generally include a number of DC bus capacitors that serve to store and release energy as needed by the load to maintain efficient operation.

The number of DC bus capacitors is at least in part determined by the voltage rating of the motor drive. For example, in one motor drive of a first rating a pair of capacitors can be placed in series to handle the given voltage of the drive. In another motor drive of a higher voltage rating, the same type of capacitors may be placed in three capacitor series with multiple parallel legs of capacitors to achieve the correct overall drive capacitance. This requires more capacitors. For example, a 480V motor drive may use 8 capacitors whereas a 690V motor drive may use 27 capacitors. Thus, as ratings increase, the number of capacitors needed to achieve the correct overall drive capacitance generally increases.

In a typical drive, the DC bus capacitors are mounted directly to the DC bus. As will be appreciated, as ratings increase a larger and larger space is consumed by the capacitors on the DC bus and within the motor drive enclosure. This has generally been addressed by increasing the size of the motor drive enclosure to accommodate the capacitors, as well as increasing the surface area of the DC bus to increase the space available to mount the capacitors.

BRIEF DESCRIPTION

The present disclosure sets forth an apparatus and method for mounting additional components, such as capacitors, to a DC bus of a motor drive. Aspects of the disclosure allow an increased number of components to be connected to the DC bus, without resorting to increasing the size of the DC bus or the size of the motor drive enclosure, by supporting capacitors on a laminated bus that is mounted to, for example, a main DC bus. This results in a more densely populated power structure, is easier to assemble, and allows power to flow through a parallel power path rather than through the capacitor bus structure resulting in reduced heat buildup, lower operating temperatures, and increased component life.

In accordance with one aspect of the disclosure, a motor drive comprises an enclosure defining an interior, an input for receiving input electrical power from a power source, an output for providing output electrical power to a load, an intermediate DC circuit including a DC bus located in the interior of the enclosure, and a modular capacitor bus electrically coupled with the intermediate DC circuit, the modular capacitor bus including at least one capacitor mounted thereto. The modular capacitor bus is mountable as a unit to the DC bus.

The DC bus and/or the capacitor bus can include a laminated bus structure. The capacitor bus can include at least two capacitors arranged in parallel. The at least two capacitors arranged in parallel can be part of a series of capacitors arranged in series. At least a portion of the DC bus and the modular capacitor bus can extend in parallel spaced-apart planes such that air can circulate between the DC bus and the modular capacitor bus. The modular capacitor bus can be supported on the DC bus. The capacitor bus can be mounted and/or secured to the DC bus with at least one fastener.

In accordance with another aspect, a modular capacitor bus that is electrically couplable to an associated DC power bus comprises at least one insulator layer, at least one conductor layer, at least one terminal for electrically coupling the at least one conductor layer to the associated DC power bus, and at least one capacitor terminal for connecting the at least one conductor to an associated capacitor.

The capacitor bus can include a laminated bus structure, which may include a plurality of positive conductor layers, a plurality of negative conductor layers, and an insulator layer between each of the conductor layers. The capacitor bus can include at least two capacitors arranged in parallel. Each of the at least two capacitors arranged in parallel can be part of a series of capacitors arranged in series. The modular capacitor bus can be generally planar and configured to be mounted to an associated DC power bus in spaced apart relation thereto such that air can circulate around the capacitor bus.

In accordance with another aspect, a method of mounting a plurality of capacitors to a DC power bus comprises mounting at least one capacitor to a capacitor bus, electrically coupling the at least one capacitor to a conductor of the capacitor bus, mounting the capacitor bus to a DC power bus such that the capacitor bus and DC power bus are in spaced relation to each other, and electrically coupling the capacitor bus to the DC power bus.

DETAILED DESCRIPTION

Figure 1:
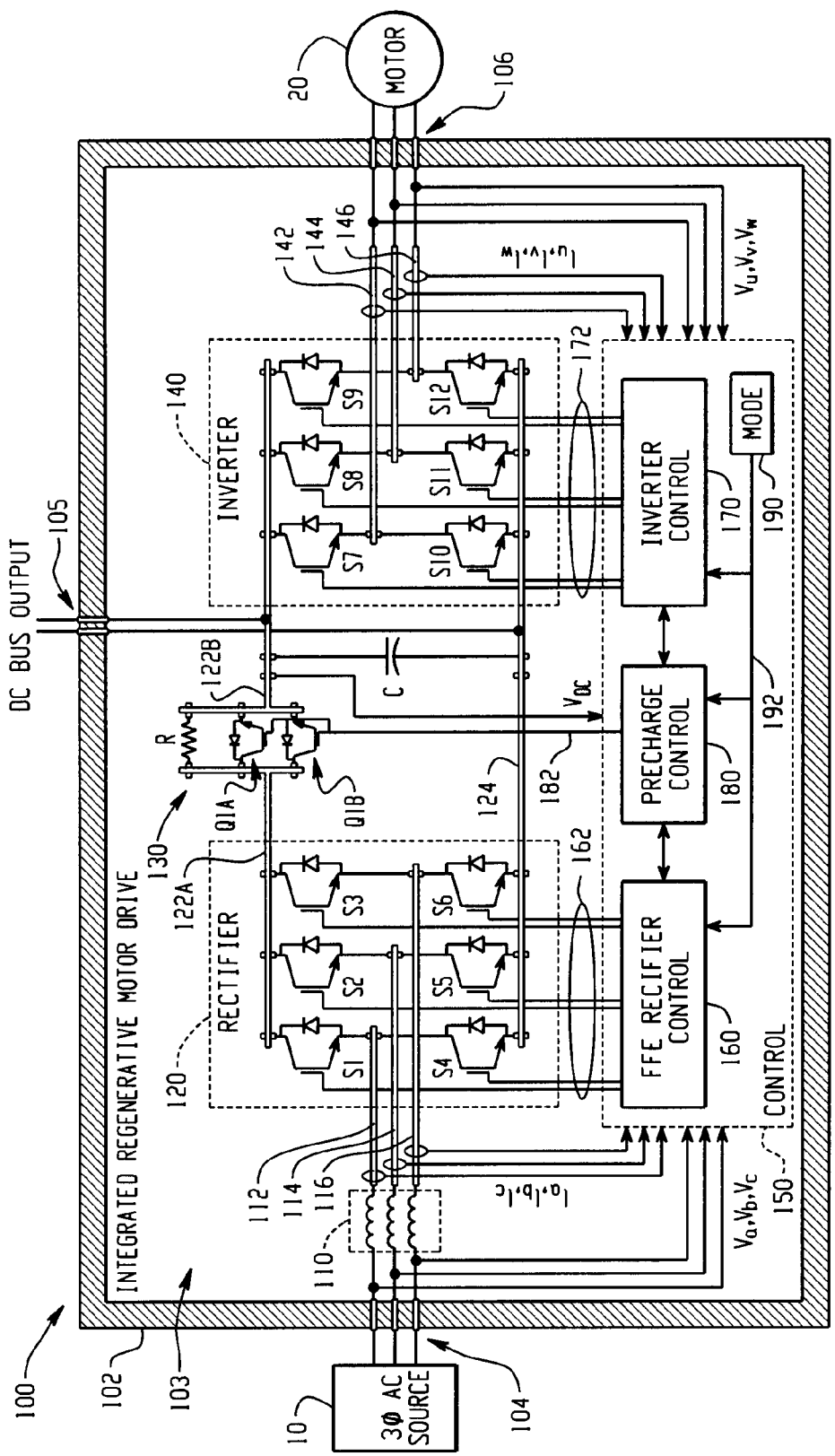
FIG. 1 is a schematic diagram illustrating an exemplary motor drive.

Referring now to the figures, several embodiments or implementations of the present disclosure are hereinafter described in conjunction with the drawings, wherein like reference numerals are used to refer to like elements throughout, and wherein the various features are not necessarily drawn to scale. A multi-phase integrated AC regenerative motor drive 100 is hereinafter illustrated and described which includes a novel capacitor configuration in accordance with the disclosure. It will be appreciated that the illustrated embodiments are merely examples, and that the capacitor bus and methods can be used in a wide variety of motor drives and are not limited to the exemplary multi-phase integrated AC regenerative motor drive disclosed herein. The illustrated drive 100 is but one type of motor drive in which aspects of the present disclosure can be embodied.

FIG. 1 illustrates an exemplary integrated AC regenerative motor drive 100. The drive 100 includes an input rectifier (converter) 120, an intermediate DC link circuit with a link capacitance C, an inverter 140, a precharging circuit 130 with one or more IGBTs Q1 (two IGBTs Q1A and Q1B shown in the drawing) and a controller 150 housed within the interior 103 of a single enclosure 102. As exemplified in FIG. 2, the enclosure 102 in one example is a structure preventing user exposure to the internal subsystems and components thereof and providing input terminals 104 for coupling to an AC input source 10 as well as output terminals 106 for connection to a driven AC motor 20. In certain embodiments, first and second DC output terminals 105 are provided to allow external access to the DC bus of the intermediate circuit, for instance, to power an external inverter or other circuit requiring DC input power. In certain embodiments, moreover, the inverter 140 and the corresponding inverter control component 170 may be omitted, whereby a power conversion system 100 is provided including the housing 102, an input rectifier 120, a DC circuit having a capacitance C, and the precharging circuit 130 including one or more IGBTs Q1 and a controller 150 housed within the interior 130 of the enclosure 102, with the DC output terminals 105 providing DC output power from the DC circuit as a common bus supply product 100.

The drive shown in FIG. 1 includes an input filter circuit 110 including line reactors connected in series in each of three AC input lines between the three-phase AC source 10 and AC input nodes 112, 114 and 116 of the switching rectifier 120. This drive, moreover, employs a fundamental front end (FFE) rectifier switching control component 160 of the controller 150 providing rectifier switching control signals 162 in a regenerating mode of operation at a frequency approximately equal to the fundamental AC input source frequency (e.g., 50 Hz or 60 Hz typically).

As seen in FIG. 1, the switching rectifier 120 includes AC input nodes 112, 114 and 116 coupled with the input terminals 104 for receiving AC power from the source 10, and provides DC output power to the intermediate DC circuit at nodes 122A (+) and 124 (−). The illustrated rectifier 120 is a three-phase input, DC output, converter stage including rectifier switching devices S1-S6 operative according to switching control signals 162 from the controller 150. In the illustrated examples, the rectifier switching devices S1-S6 are IGBTs each having an associated freewheeling diode, but other forms of electrical switching devices can be used. The DC output nodes of the rectifier 120 are coupled with the intermediate DC circuit which includes the precharging circuit 130 disposed in the upper (e.g., positive) current path of the DC link circuit, as well as a DC link capacitance C coupled between the upper and lower DC current paths of the link circuit, with the precharging circuit 130 located between the upper terminal of the link capacitance C and the positive output of the rectifier 120.

The inverter 140 in certain embodiments receives DC power from the intermediate DC circuit and provides three-phase AC electrical power to drive the motor load 20 by DC-AC conversion using inverter switching devices S7-S12, which can be any suitable form of electronically actuatable switching devices, such as IGBTs in the illustrated embodiments. In other possible implementations, the inverter 140 and associated inverter control component 170 can be omitted, and the power conversion system 100 may include DC bus output terminals 105 electrically coupled with the positive and negative DC bus terminals of the intermediate circuit in order to provide DC output power flow to or from an external device (not shown). In some embodiments, moreover, the inverter 140 and associated controller 170 may be included within the drive system 100, and the drive 100 may provide the DC output terminals 105 for selectively providing DC output power to, or receiving power from, an external device. The active rectifier 120 is operated by rectifier switching control signals 162 from the rectifier controller 160, and the inverter 140 is operated by inverter switching control signals 182 from the inverter controller component 170 of the controller 150. Other forms of rectifier and/or inverter switching devices S1-S12 can be used having appropriate control terminals operated according to the switching control signals 162, 182 (e.g., semiconductor-based switches such as silicon controlled rectifiers (SCRs), gate turn-off thyristors (GTOs), gate commutated thyristors (GCTs) such as integrated gate commutated thyristors (IGCTs) or symmetrical gate commutated thyristors (SGCTs)), etc.).

The controller 150 includes a rectifier controller 160, an inverter controller 170 (omitted in certain embodiments) and a precharge controller 180 operable according to a current operational mode 190, where the operational mode of the motor drive 100 can be set by an external mode selection signal or value (not shown) from a user or from another system, and/or the mode 190 can be set based on internal conditions within the drive 100. The controller 150 and the components thereof may be implemented as any suitable hardware/processor-executed software, processor-executed firmware, logic, and/or combinations thereof wherein the illustrated embodiment can be implemented largely in processor-executed software or firmware providing various control functions by which the controller 150 receives feedback and/or input signals and/or values (e.g., setpoint(s)) and provides the switching control signals 162, 172, 182 to operate the switching devices S1-S6 of the rectifier 120, the switches S7-S12 of the inverter, and the IGBT(s) Q1 of the precharging circuit 130. In addition, the controller 150 and the components 160, 170, 180, 190 thereof can be implemented in a single processor-based or one or more of these can be separately implemented in unitary or distributed fashion by two or more processor devices.

Figure 2:
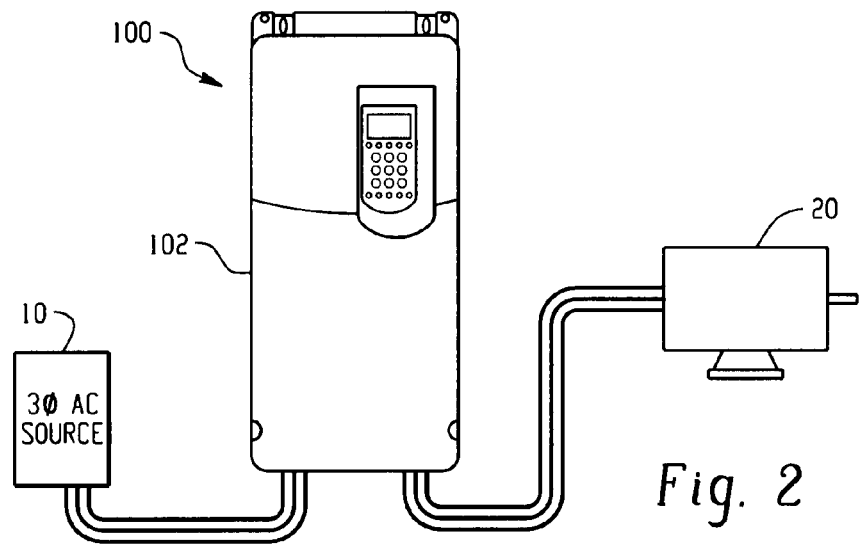
FIG. 2 is a front elevation view illustrating an exemplary wall-mount integrated regenerative motor drive of FIG. 1 coupled with a three-phase AC power source and a three-phase AC motor load.

The exemplary controller 150 operates in one of three different modes, including a first mode for precharging the DC link capacitance C, a second mode for conducting regenerative current toward the AC source 10, and a third mode (motoring) for providing drive power to operate the AC motor 20. In certain embodiments, non-regenerative systems 100 are provided, in which the controller 150 operates only in the first mode for precharging the DC capacitance C and the third mode for providing output power, whether via the DC output terminals 105 (common bus supplied product 100) and/or providing AC output power for driving a motor load. In one or more of these operational modes, the controller 150 utilizes various feedback information including measured input line-line or line-neutral voltages Va, Vb, Vc, sensed AC input line current values Ia, Ib, Ic (obtained via current sensors disposed between the input filter circuit 110 and the rectifier 120 in one example), measured DC link voltage VDC, and/or sensed AC output currents and voltages Iu, Iv, Iw and Vu, Vv, Vw, etc. In addition, the controller 150 includes suitable interface circuitry in order to receive the various input and/or feedback signals and/or values, as well as suitable driver circuitry for generating switching control signals 162, 172, 182 of suitable electrical characteristics to actuate the associated switching devices S1-S6, Q1, S7-S12 operated according to the signals. As seen in FIG. 2, moreover, the motor drive 100 may include a user interface accessible from the exterior of the enclosure 102 by which a user may interact with the controller 150 in order to set operating values (e.g., setpoints, mode 190, etc.), view sensed operating conditions, etc.

The switching control signals 162, 172 for the switching devices S1-S12 of the rectifier 120 and/or inverter 140 may be provided by the controller 150 using any suitable switching scheme, which may involve one or more pulse width modulation (PWM) techniques including without limitation vector modulation (SVM), selective harmonic illumination (SHE), etc. In addition, the various components within the control system 150 may operate according to setpoint source other signals/values provided by another one of the control components. For instance, the inverter control 170 during normal motoring operation may provide a DC voltage setpoint signal or value to the rectifier controller 160, with the rectifier controller 160 regulating its output voltage according to the setpoint from the inverter controller 170. Moreover, operation of the rectifier 120, the precharging circuit 130, and the inverter 140 are coordinated by the controller 150 and the components 160, 180, and 170 thereof based on the currently selected operational mode 190.

Figure 3:
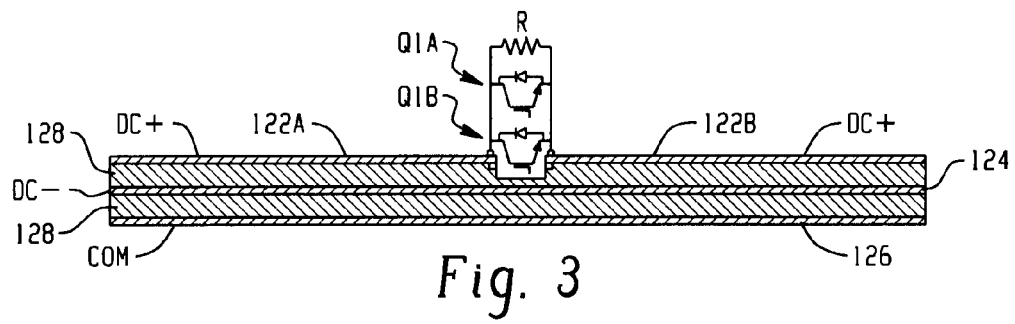
FIG. 3 is a partial side elevation view in section illustrating an exemplary laminated DC intermediate circuit implementation in the motor drive of FIGS. 1-2.

Referring also to FIG. 3, the illustrated intermediate DC link circuit may be constructed in certain embodiments using a laminated plate structure including a pair of upper (+) conductive (e.g., aluminum) conductor portions 122A and 122B separated by the precharging circuit 130 and together constituting a first DC current path 122, as well as a second conductive (e.g., aluminum) plate 124 constituting a lower (−) DC current path 124, with the plates 122 and 124 being separated by an intervening electrical insulator layer 128. In certain embodiments, moreover, a third conductive (e.g., aluminum) plate 126 may be provided for a DC ground or system common spaced from the other plates using an insulative layer 128, where the various switching devices S1-S12 and Q1 may be electrically and mechanically connected to the corresponding plates 122, 124 using bolts and/or other fasteners for connection through associated holes in the plates 122, 124, 126 and insulation layers 128 to provide conductive connection where appropriate and spacing to avoid electrical connection where a given switching device terminal is passing through a conductive plate to which it is not to be electrically connected. In some embodiments, the conductive plates and insulating layers can also be combined into a single printed circuit board (PCB) to accomplish the same design goals, and the laminated structures of the present disclosure are not limited to any one type of construction. In the past, capacitors would be mounted directly to the laminated plate structure of the DC link circuit illustrated in FIG. 3.

Figure 4:
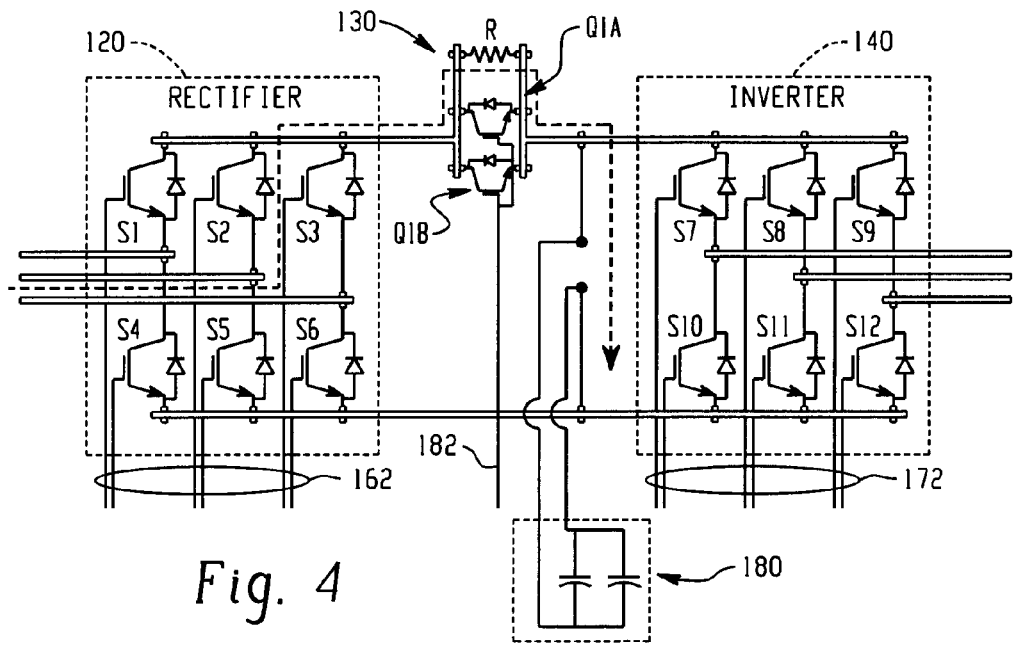
FIG. 4 is a simplified schematic diagram illustrating features of the motor drive of FIGS. 1-2 including a capacitor bus in accordance with the present disclosure.

Turning to FIG. 4, and in accordance with the present disclosure, a split laminated DC bus structure is schematically illustrated. It will be appreciated that this split laminated DC bus structure can be implemented in the motor drive 100 described above, and enables a more densely-packed motor drive to be assembled to achieve higher top-of-frame ratings for a given enclosure. As will now be described, the exemplary split laminated DC bus structure includes a separate capacitor bus 180 mounted to and electrically coupled with a DC bus, wherein the capacitor bus supports a capacitance in spaced relation to the main DC bus.

Figure 5:
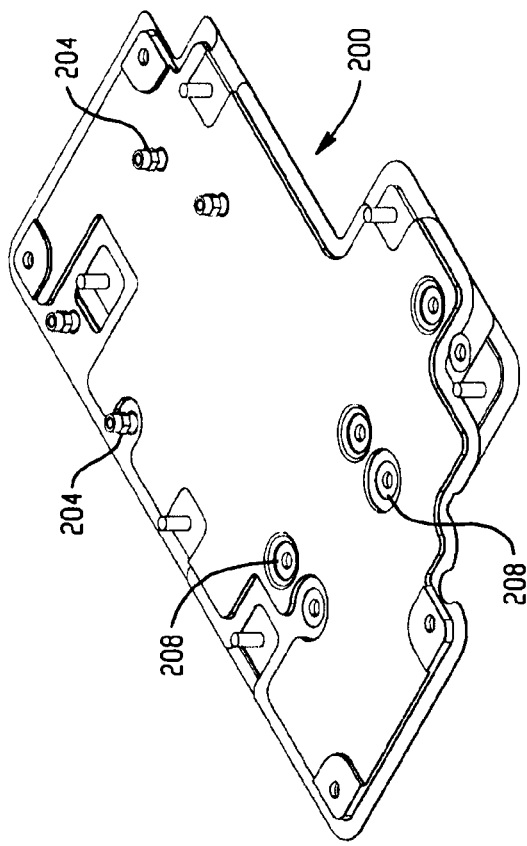
FIG. 5 is a perspective view of an exemplary laminated power bus.
Figure 6:
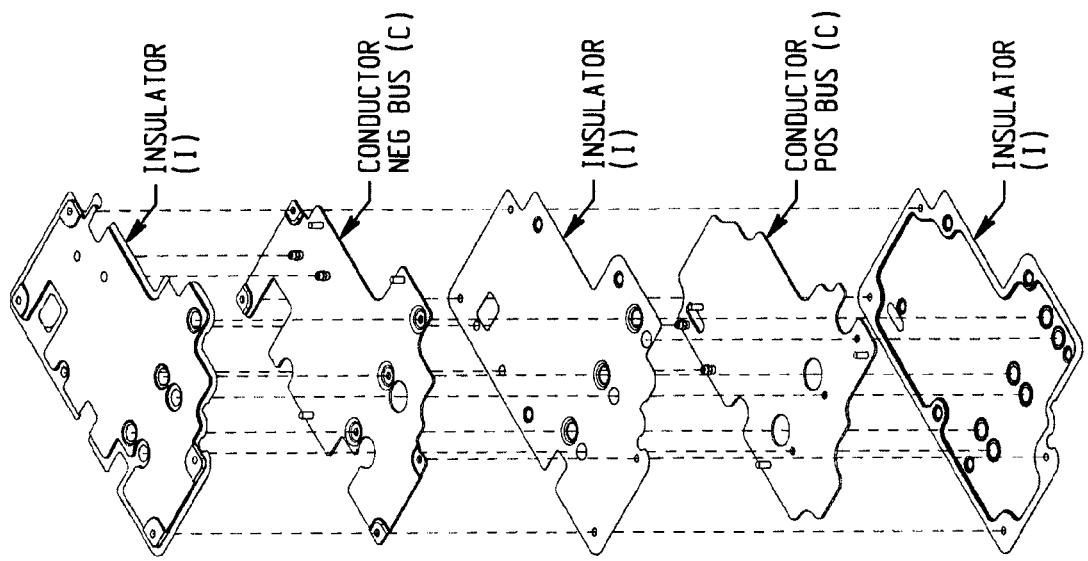
FIG. 6 is an exploded view of the exemplary laminated power bus of FIG. 5.

Turning to FIGS. 5 and 6, an exemplary DC power bus is illustrated and identified generally by reference numeral 200. The DC power bus 200 includes multiple layers of insulators I and conductors C that are sandwiched together to form a laminated structure having both a positive bus and a negative bus isolated between respective insulator layers. The DC power bus 200 includes a plurality of terminals T, or connection points for electrically coupling the DC power bus 200 with other components, such as the capacitor bus as will be described. In addition, the DC power bus 200 includes terminals 204 for electrically coupling the DC power bus with the capacitor bus, as will be described in more detail below. In addition, other contacts 208 are provided for connecting other typical components to the DC power bus. It will be appreciated that the DC power bus 200 can be implemented as an intermediate DC link circuit, such as described in FIG. 3

Figure 7:
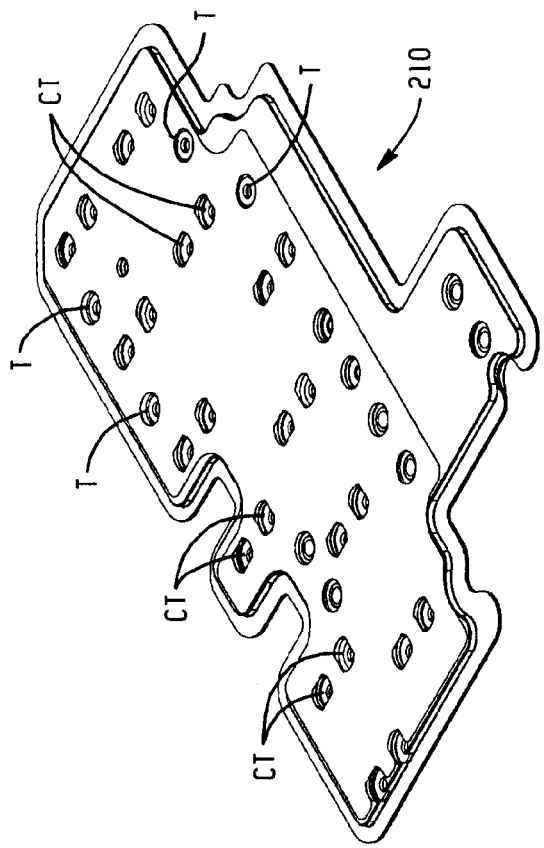
FIG. 7 is a perspective view of an exemplary capacitor bus in accordance with the present disclosure.
Figure 8:
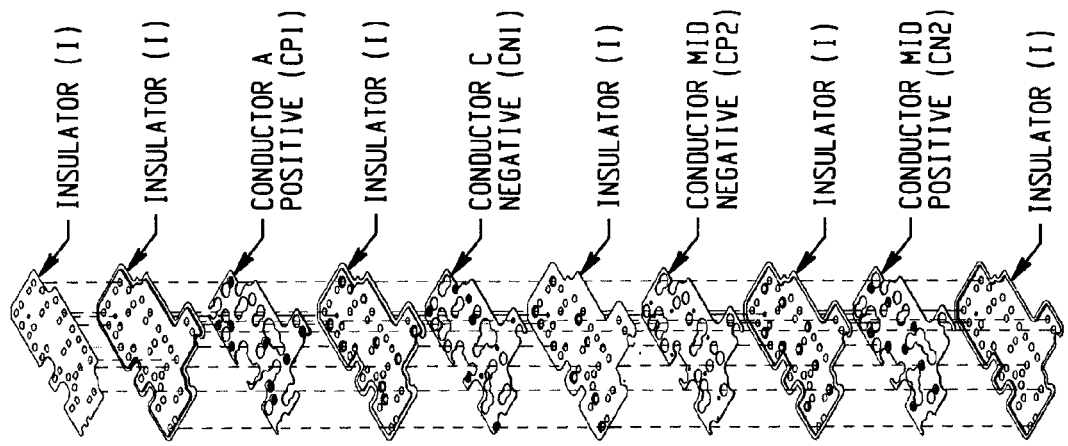
FIG. 8 is an exploded view of the exemplary capacitor bus of FIG. 7.

Turning to FIGS. 7 and 8, an exemplary capacitor bus 210 in accordance with the present disclosure is illustrated. It will be appreciated that the illustrated capacitor bus 210 is a laminated bus having multiple layers of insulators I and conductors C sandwiched together and otherwise generally constructed in a similar manner as the DC power bus. Depending on the particular desired arrangement of capacitors on the capacitor bus, there may be multiple pairs of positive and negative conductor layers in the capacitor bus 210 to allow parallel connection of one or more series of capacitors with the DC power bus 200. The illustrated exemplary capacitor bus 210 includes a first positive conductor CP1 and a first negative conductor CN1 forming a first pair of conductors, a second positive conductor CP2 and a second negative conductor CN2 forming a second pair of conductors. A plurality of capacitor terminals CT are arranged in pairs for coupling capacitors to the respective conductors. Thus, two (or more) banks of capacitors can be mounted to the capacitor bus 210 in series, and said banks then connected to the DC power bus in parallel (such as is shown in FIG. 4).

For connecting the capacitor bus 210 to the DC power bus, a number of terminals T are also provided on the capacitor bus for connection to mating terminals T of the DC power bus. As will be appreciated, the capacitor bus 210 can have multiple parallel branches of capacitors mounted in series, and each parallel branch of capacitors can be configured to be electrically coupled to the DC power bus.

Figure 10:
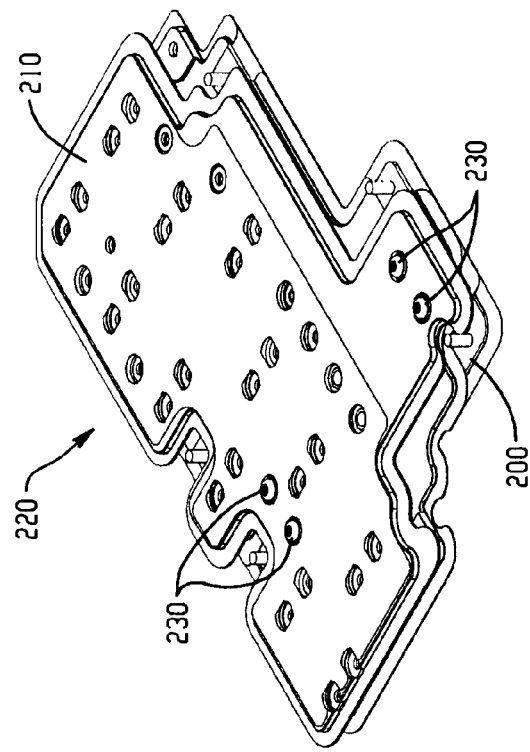
FIG. 10 is a perspective view of a split DC laminated bus in accordance with the disclosure.
Figure 9:
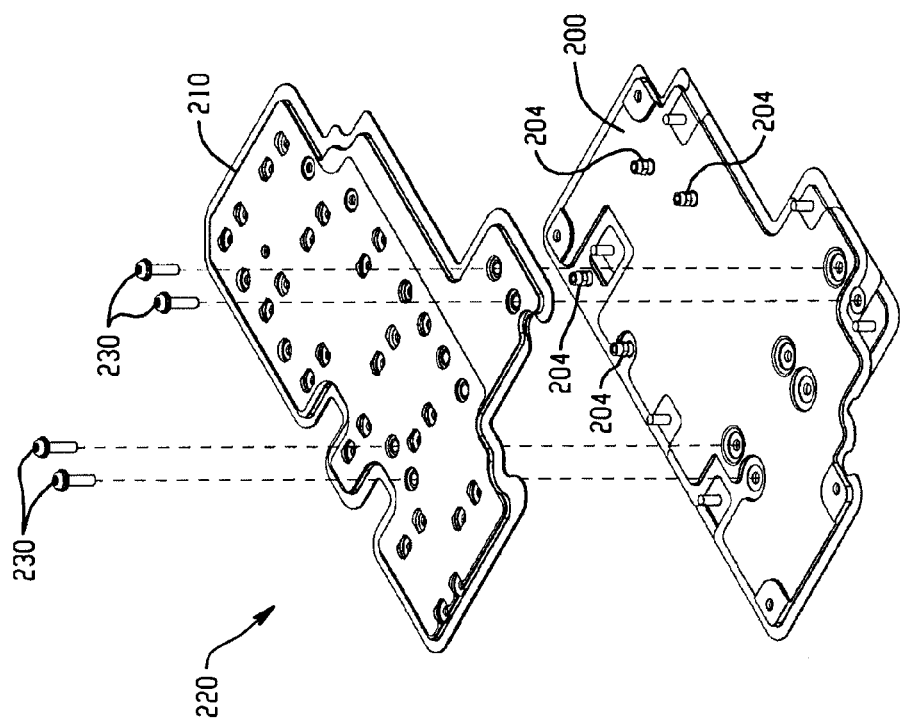
FIG. 9 is an exploded view of an exemplary power bus and capacitor bus assembly in accordance with the disclosure.

With further reference to FIGS. 9 and 10, an exemplary split laminated DC bus 220 in accordance with the disclosure is illustrated. The split laminated DC bus 220 includes DC power bus 200 and capacitor bus 210 mounted together and secured with fasteners, such as hex screws 230. Spacers, bushing, or the like can be used to support the capacitor bus 210 in spaced relation to the DC power bus 200 such that air can circulate between the respective buses. This can increase the ability of heat to dissipate from the buses to thereby reduce temperatures during operation. It will be appreciated that one or more capacitors can be mounted to the surface of the capacitor bus 210 opposite the DC power bus 200 such that said capacitors extend from the capacitor bus 210 in a direction away from the DC power bus 200 (not shown in FIG. 10).

Figure 11:
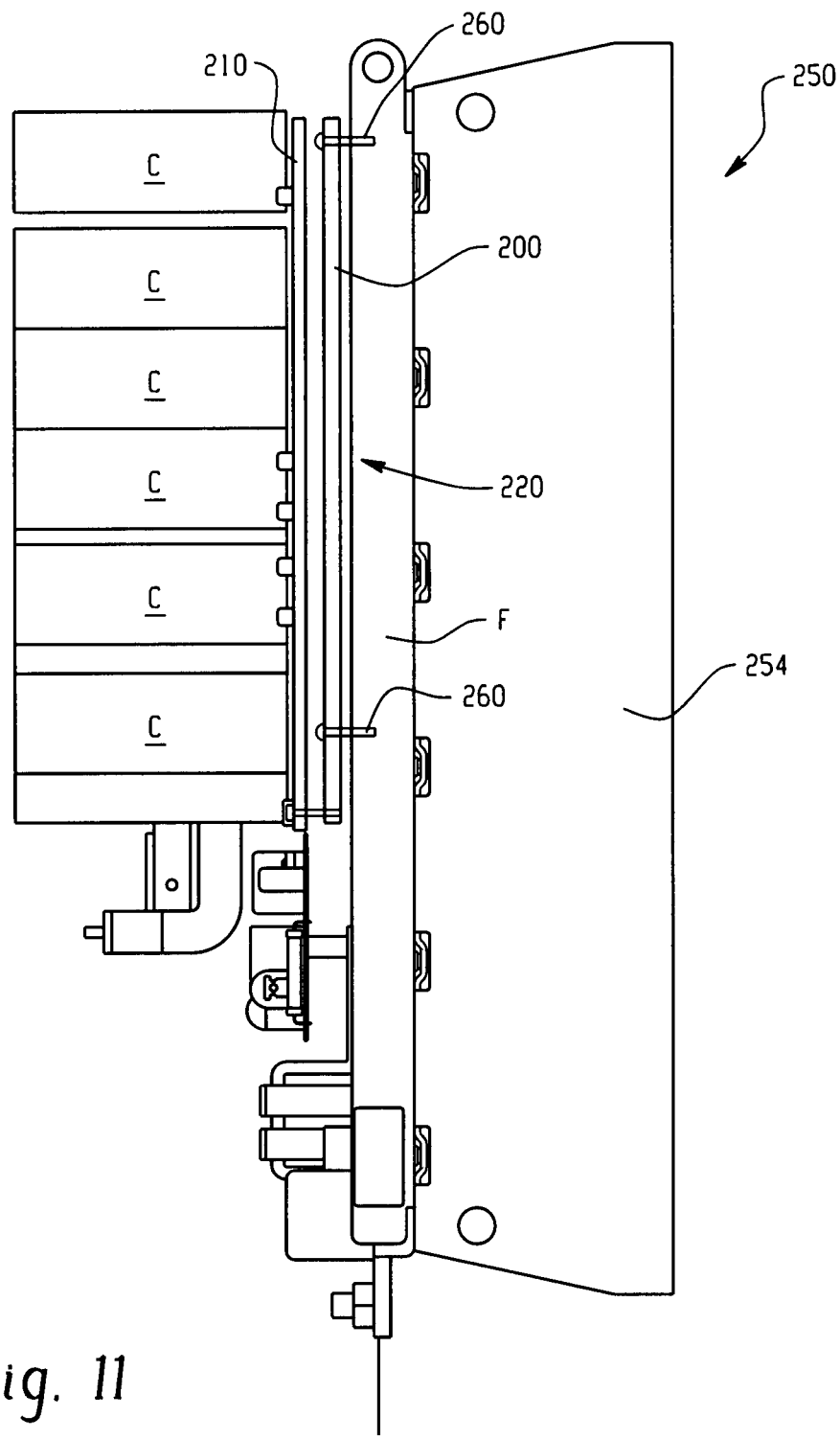
FIG. 11 is an exemplary motor drive including the split DC laminated bus of FIG. 10.

Turning now to FIG. 11, the split laminated DC bus 220 is shown installed in an exemplary motor drive 250. The motor drive 250 includes an enclosure 254 in which the various motor drive components are supported including the split DC laminated bus 250. A portion of the enclosure 254 has been removed to expose the split DC laminated bus 250. As can be seen, the DC power bus 200 is mounted to a frame F of the motor drive with fasteners, such as bolts 260. The capacitor bus 210 is mounted to the DC power bus 210, and a plurality of capacitors C are mounted to the capacitor bus 210 in the manner described above The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A motor drive, comprising:
an input for receiving input electrical power from a power source;
an output for providing output electrical power to a load;
a DC circuit including a DC bus connecting the input and the output; and
a capacitor bus electrically coupled with the DC circuit, the capacitor bus including a planar surface and at least one capacitor mounted thereto, the at least one capacitor extending outwardly from a single side of said planar surface;
wherein the capacitor bus includes a laminated bus structure mounted as a unit to the DC bus, the laminated bus structure having a first positive conductor and a first negative conductor forming a first pair of conductors, and a second positive conductor and a second negative conductor forming a second pair of conductors, the at least one capacitor being coupled to one of the first or second pair of conductors.

2. The motor drive of claim 1, wherein a plurality of pairs of capacitor terminals accessible from a single side of the capacitor bus.

3. The motor drive of claim 1, wherein at least a portion of the DC bus and the capacitor bus extend in parallel spaced-apart planes such that air can circulate between the DC bus and the capacitor bus.

4. The motor drive of claim 1, wherein the capacitor bus is supported on the DC bus.

5. The motor drive of claim 1, wherein the capacitor bus is mounted to the DC bus with at least one fastener, and at least one spacer is interposed between the DC bus and the capacitor bus.

6. The motor drive of claim 1, wherein the motor drive is mountable to a wall.

7. The motor drive of claim 2, wherein the capacitor bus includes at least two capacitors mounted thereto and arranged in parallel, each of the capacitors coupled to a respective one of the first or second pair of conductors.

8. The motor drive of claim 7, wherein each of the at least two capacitors arranged in parallel is part of a series of capacitors arranged in series.

9. A capacitor bus electrically couplable to an associated DC power bus comprising:
a plurality of insulator layers;
a plurality of conductor layers, each conductor layer disposed between respective insulator layers;
at least two terminals for electrically coupling at least two of the conductor layers to the associated DC power bus;
wherein each conductor layer includes at least one capacitor terminal for connecting the conductor layer to an associated capacitor, each of the capacitor terminals accessible from a single common side of the modular capacitor bus;
wherein the capacitor bus includes a planar surface bounded by a peripheral edge, each capacitor terminal being spaced from the peripheral edge;
whereby a plurality of capacitors can be connected to respective pairs of the plurality of conductor layers and supported on said single side of said capacitor bus;
wherein the capacitor bus includes a laminated bus structure;
wherein the laminated bus structure has a first positive conductor and a first negative conductor forming a first pair of conductors, and a second positive conductor and a second negative conductor forming a second pair of conductors, whereby the plurality of capacitors are couplable to one of the first or second pair of conductors.

10. The capacitor bus of claim 9, further comprising at least two capacitors supported on said single side of the capacitor bus and electrically coupled in parallel.

11. The capacitor bus of claim 9, wherein the capacitor bus is generally planar and configured to be mounted to an associated DC power bus in spaced apart relation thereto such that air can circulate around the capacitor bus.

12. The capacitor bus of claim 9, further comprising a plurality of pairs of capacitor terminals located adjacent to each other and in close proximity to each other for connection to a respective capacitor, each of the terminals of each pair associated with a different one of the plurality of conductor layers.

13. The capacitor bus of claim 10, wherein each of the at least two capacitors arranged in parallel is part of a series of capacitors arranged in series.

14. The capacitor bus of claim 12, wherein the pairs of capacitor terminals are arranged in rows across the capacitor bus.

15. A method of mounting a plurality of capacitors to a DC power bus comprising:
mounting at least two capacitors to a capacitor bus having a laminated bus structure having a first positive conductor and a first negative conductor forming a first pair of conductors, and a second positive conductor and a second negative conductor forming a second pair of conductors, a plurality of conductor layers, each conductor layer disposed between adjacent insulator layers, the at least two capacitors being supported on a single first side of the capacitor;
electrically coupling the at least two capacitors to a respective pair of conductor layers of the capacitor bus via capacitor terminals accessible from a single side of the capacitor bus;
mounting the capacitor bus to a DC power bus such that a second side of the capacitor bus opposite the first side faces the DC power bus, the capacitor bus and DC power bus being in spaced relation to each other such that air can circulate therebetween; and
electrically coupling the capacitor bus to the DC power bus.

16. The method of claim 15, wherein the mounting at least two capacitors includes mounting at least two banks of capacitors to the capacitor bus.

17. The method of claim 16, wherein the mounting at least two banks of capacitors includes mounting the two banks of capacitors in parallel.

* * * * *